(12) United States Patent
Menchtchikov et al.

(10) Patent No.: US 7,462,430 B2
(45) Date of Patent: Dec. 9, 2008

(54) METHOD AND ARRANGEMENT FOR PREDICTING THERMALLY-INDUCED DEFORMATION OF A SUBSTRATE, AND A SEMICONDUCTOR DEVICE

(75) Inventors: Boris Menchtchikov, Eindhoven (NL); Frederik Eduard De Jong, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 293 days.

(21) Appl. No.: 11/546,551

(22) Filed: Oct. 12, 2006

(65) Prior Publication Data

US 2007/0090853 A1 Apr. 26, 2007

Related U.S. Application Data

(63) Continuation-in-part of application No. 11/247,594, filed on Oct. 12, 2005.

(51) Int. Cl.
*G03C 5/00* (2006.01)
*G03F 9/00* (2006.01)

(52) U.S. Cl. .................... 430/30; 430/302; 430/311

(58) Field of Classification Search .................. 430/30, 430/302, 311
See application file for complete search history.

(56) References Cited

U.S. PATENT DOCUMENTS 7,250,237 B2 * 7/2007 Ottens et al. .................. 430/30

2002/0053644 A1 * 5/2002 Yonekawa ............... 250/492.1
2005/0136346 A1 6/2005 Ottens et al.

FOREIGN PATENT DOCUMENTS

| EP | 0 877 297 | * 11/1998 |
| EP | 1548504 | 6/2005 |
| JP | 4-192317 | * 7/1992 |

OTHER PUBLICATIONS

Chang et al., Thermomechanical global response of the EUVL wafer during exposure, *Proc.SPIE* vol. 4688, 755-766 (2002).
European Search Report for EP Appl. No. 06122153.7-2222 issued Jan. 29, 2007.

* cited by examiner

*Primary Examiner*—Christopher G Young
(74) *Attorney, Agent, or Firm*—Pillsbury Winthrop Shaw Pittman LLP

(57) ABSTRACT

The invention provides a method for correcting thermally-induced field deformations of a lithographically exposed substrate. First, a model is provided to predict thermally-induced field deformation information of a plurality of fields of the substrate. The pre-specified exposure information used to configure an exposure of the fields is then modified based on the thermally-induced deformation information as predicted by the model. Finally a pattern is exposed onto the fields in accordance with the pre-specified exposure information as modified. The predicting of thermally-induced field deformation information by the model includes predicting of deformation effects of selected points on the substrate. It is based on a time-decaying characteristic as energy is transported across substrate; and a distance between the selected points and an edge of the substrate.

13 Claims, 10 Drawing Sheets

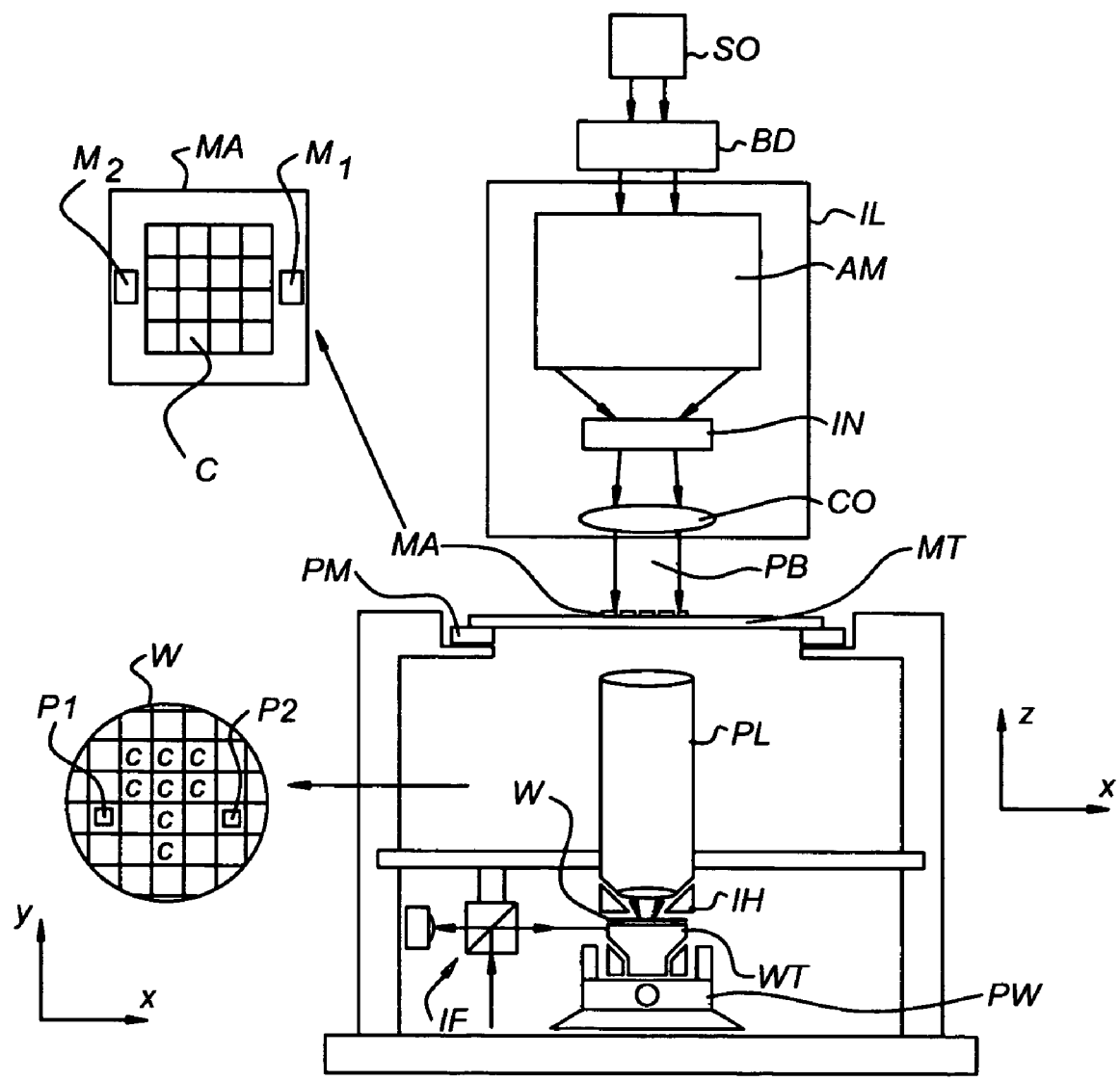
Fig 1 *Prior art*

Fig 2  *Prior art*
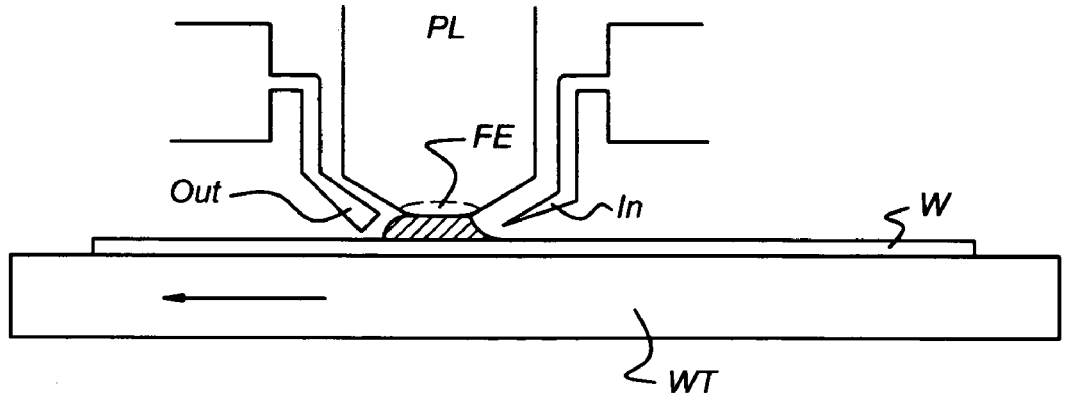
Fig 3  *Prior art*
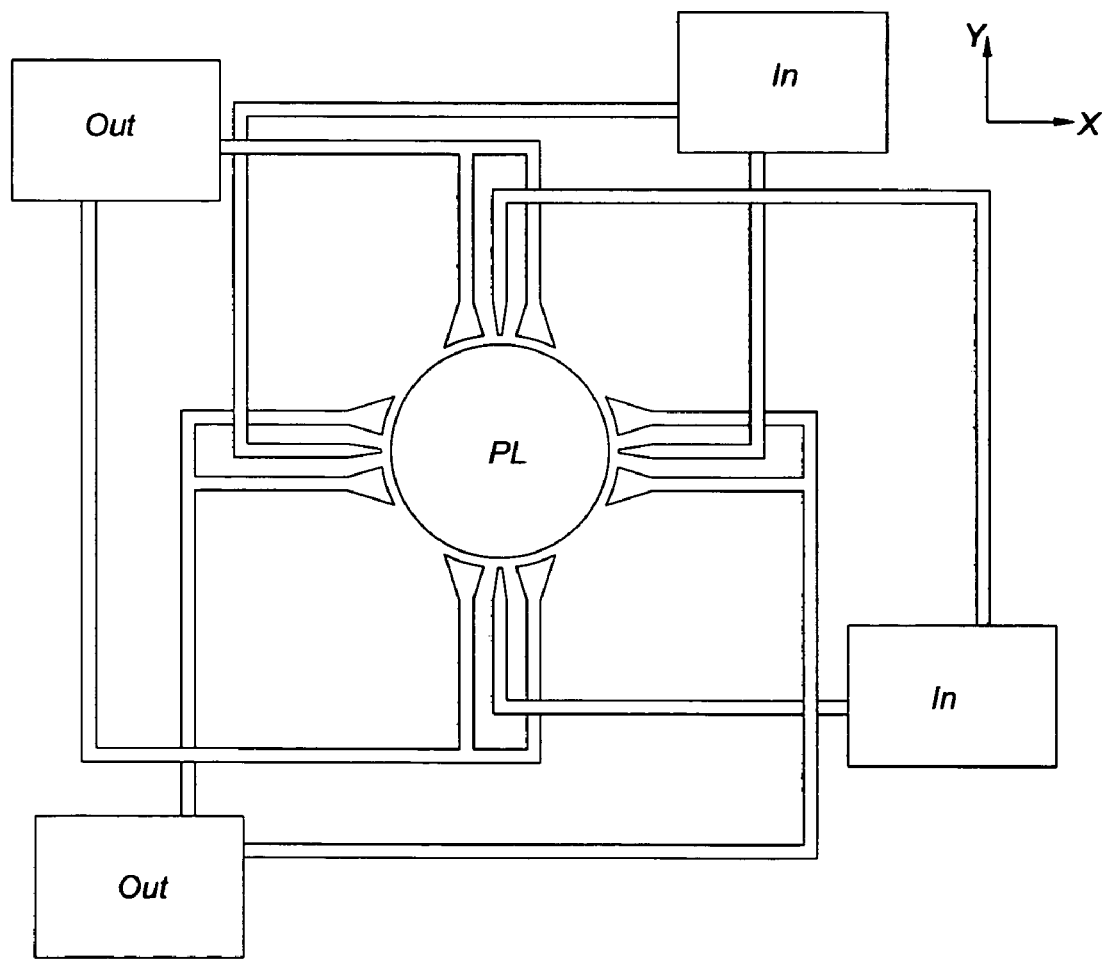

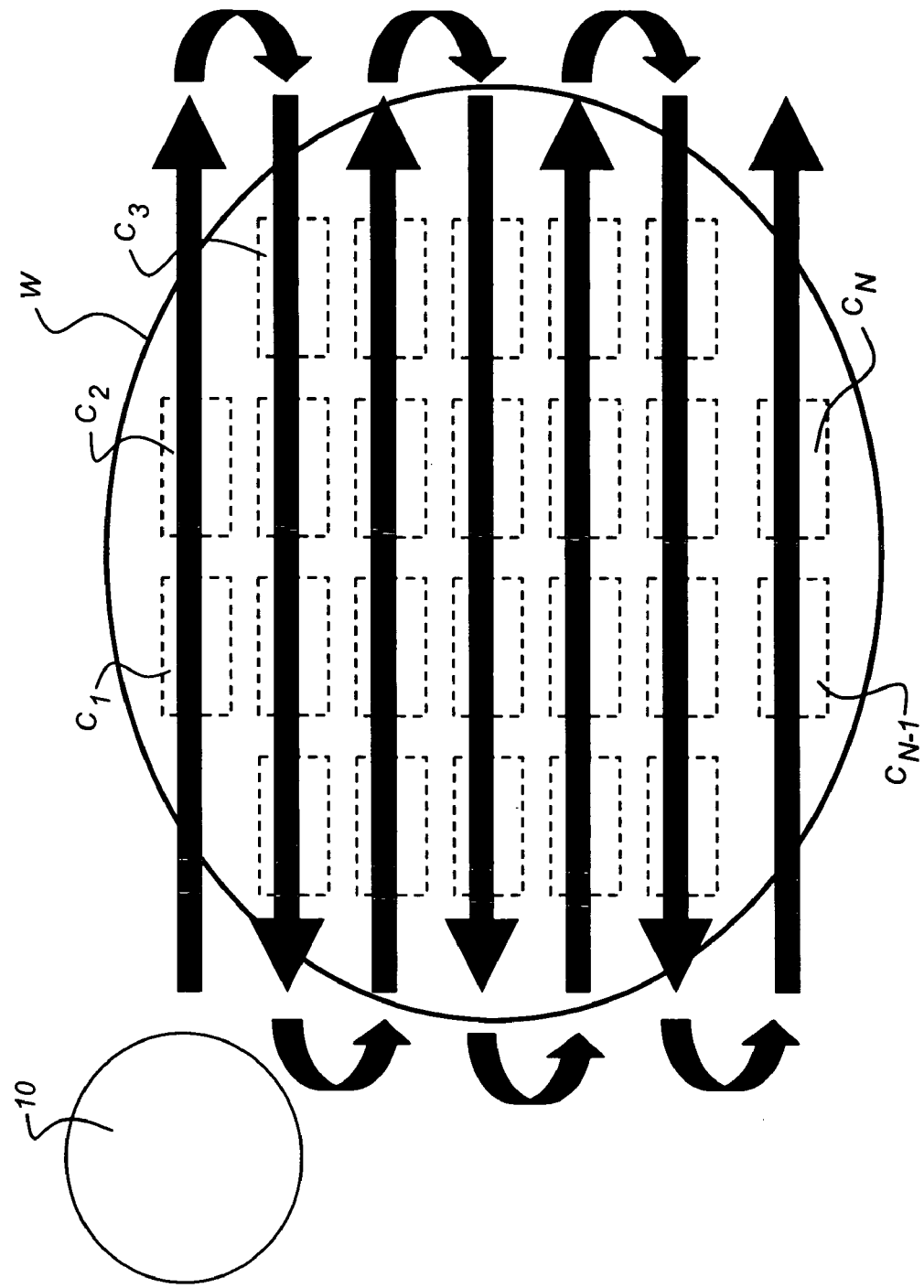

US 7,462,430 B2

METHOD AND ARRANGEMENT FOR PREDICTING THERMALLY-INDUCED DEFORMATION OF A SUBSTRATE, AND A SEMICONDUCTOR DEVICE

The present invention is a continuation-in-part of and claims priority to U.S. patent application Ser. No. 11/247,594 filed Oct. 12, 2005, which is hereby incorporated by reference.

FIELD

The present invention relates to an arrangement and a method for manufacturing a device and to a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The demand for smaller and smaller semiconductor devices drives the need to have lithographic fabrication processes achieve pattern features and profiles having smaller critical dimensions. Moreover, such devices may comprise multiple layers, requiring precise positioning of successive layers over one or more prior layers. It is important that these smaller devices are consistently reproduced with as little overlay errors as possible to yield high-quality devices.

During a lithographic fabrication process, there are, however, numerous activities that contribute to overlay errors and compromise the quality of the exposed patterns. In particular, an exposed substrate is subject to thermal energy. In case of an optical lithographic apparatus the thermal energy substrate heating may result in deformations of a field on the substrate under exposure. In an immersion lithographic apparatus the substrate deformation is caused by immersion liquid evaporation that induces deformations of each field. Such thermally-induced deformations may result in unacceptable overlay and focusing errors and significantly reduce yield production.

SUMMARY

It is desirable to provide a method for predicting thermally-induced field deformations of a substrate to be exposed lithographically with an improved performance in view of the prior art.

To that end, the invention provides a method for predicting thermally-induced field deformation of a substrate to be exposed lithographically comprising:

providing pre-specified exposure information;

using a model to predict thermally-induced field deformation at selected points of the substrate based on the pre-specified exposure information; wherein the model is based on a time-decaying characteristic as energy is transported across said substrate; and a distance between the selected points and an edge of said substrate.

The invention further provides a semiconductor device produced with aforementioned method.

The invention further provides an arrangement for predicting thermally-induced field deformation of a substrate characterized by:

an input port arranged to received pre-specified exposure information;

a processor unit connected to the input port and arranged to employ a model to predict thermally-induced field deformation at selected points of the substrate to be exposed based on the received pre-specified exposure information, wherein the model is based on a time-decaying characteristic as energy is transported across said substrate and to determine improved exposure information based on the predicted thermally induced field deformation; and a distance between the selected points and an edge of said substrate.

Finally, the invention further relates to a semiconductor device produced with aforementioned arrangement.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 1 depicts a lithographic apparatus according to an embodiment of the invention;

FIGS. 2 and 3 show a liquid supply system used in a prior art lithographic projection apparatus;

FIG. 7 schematically shows an exemplary trajectory of a projection system with respect to a substrate to be exposed in a prior art lithographic projection apparatus;

DETAILED DESCRIPTION

Figure 4A:
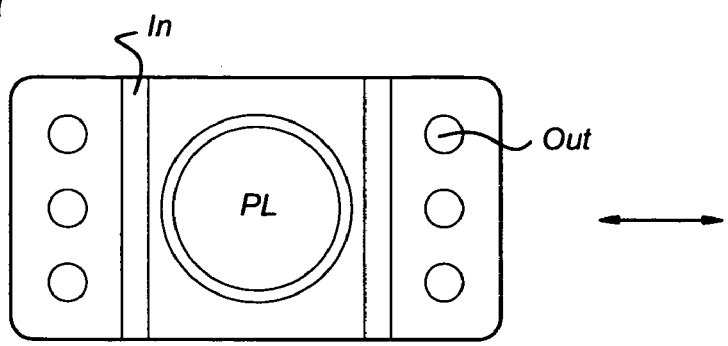
FIGS. 4a and 4b show a liquid supply system according to another prior art lithographic projection apparatus.

FIG. 1 schematically depicts a lithographic apparatus according to one embodiment of the invention. The apparatus comprises:

an illumination system (illuminator) IL configured to condition a radiation beam B (e.g. UV radiation or EUV-radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror-matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless. lithography that utilizes programmable patterning device, such as a programmable mirror array of a type as referred to above.

Combinations and/or variations on the above described modes of use or entirely different modes of use may also be employed.

Different solutions are known to provide a lithographic apparatus using immersion techniques. A known system for providing a liquid is to use a system to provide liquid on only a localized area of the substrate W and in between a final element FE of the projection system PL and the substrate W using a liquid confinement system (substrate W generally has a larger surface area than the final element FE of the projection system PL). A known way to arrange for this is illustrated in FIGS. 2 and 3, in which liquid is supplied by at least one inlet IN onto the substrate W, preferably along the direction of movement of the substrate W relative to the final element FE, and is removed by at least one outlet OUT after having passed under the projection system PL. That is, as the substrate W is scanned beneath the element in a −X direction, liquid is supplied at the +X side of the element and taken up at the −X side.

FIG. 2 schematically shows the arrangement in which liquid is supplied via inlet IN and is taken up on the other side of the element by outlet OUT which is connected to a low pressure source. In FIG. 2, the liquid is supplied along the direction of movement of the substrate W relative to the final element FE, though this does not need to be the case. Various orientations and numbers of in- and out-lets positioned around the final element are possible. One example is illustrated in FIG. 3 in which four sets of an inlet with an outlet on either side are provided in a regular pattern around the final element.

Figure 4B:
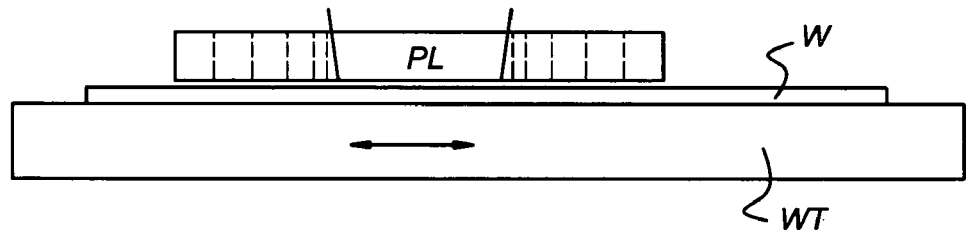

Another solution which has been proposed is to provide the liquid supply system with a seal member which extends along at least a part of a boundary of the space between the final element FE of the projection system PL and the substrate table WT. Such a solution is illustrated in FIG. 4. The seal member is substantially stationary relative to the projection system in the XY plane though there may be some relative movement in the Z direction (in the direction of the optical axis). A seal is formed between the seal member and the surface of the substrate. Preferably the seal is a contactless seal such as a gas seal.

Figure 5:
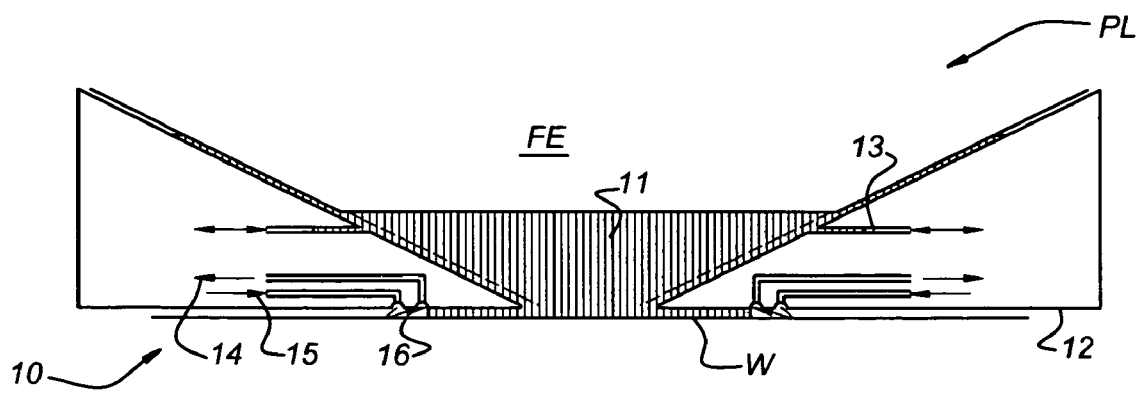
FIG. 5 shows a further view of the liquid supply system according to a prior art lithographic projection apparatus.

In an immersion arrangement, a liquid 11 is pumped into one side of the apparatus and out of the other side of the apparatus. As shown in FIG. 5, a reservoir 10 forms a contactless seal to the substrate W around an image field of the projection system PL so that liquid is confined to fill a space between the substrate surface and the projection system PL, and in one embodiment between the substrate W and the final element FE of the projection system PL. The reservoir 10 is formed by a seal member 12 positioned below and surrounding the final element FE of the projection system PL. Liquid 11 is brought into the space below the projection system PL and within the seal member 12. The seal member 12 extends a little above a lower surface of the final element FE of the projection system and the liquid level rises above the final element FE such that a buffer of liquid is 11 provided. The liquid filled space of seal member 12 has an inner periphery that at the upper end preferably closely conforms to the shape of the projection system PL or the final element FE thereof and may, e.g., be round. At the bottom, the inner periphery of the liquid filled space closely conforms to the shape of the image field, e.g., rectangular though this need not be the case.

The liquid 11 is confined in the reservoir 10 by a gas seal 16 between the bottom of the seal member 12 and the surface of the substrate W. The gas seal 16 is formed by gas, e.g. air or synthetic air but preferably $N_2$ or another inert gas, provided under pressure via an inlet 15 to the gap between seal member 12 and substrate W and extracted via a first outlet 14. An overpressure on the gas inlet 15, a lower pressure (e.g. a vacuum level) on the first outlet 14 and geometry of the gap are arranged such that there is a high-velocity air flow inwards that confines the liquid 11.

A lithographic exposure process employed to project a pattern on target field C on substrate W may cause pattern deformations, like pattern shifts, due to absorption or dissipation of thermal energy by the substrate W during exposure. Such thermally induced deformations may result in unacceptable overlay errors in the substrate W. In a non-immersion lithographic exposure apparatus, these thermally-induced deformations do result from an absorption of thermal energy, which heats up the substrate W locally. In an immersions system, however, these thermally-induced deformations result from cooling of the substrate W due to evaporation of the immersion liquid 11.

Figure 6A:
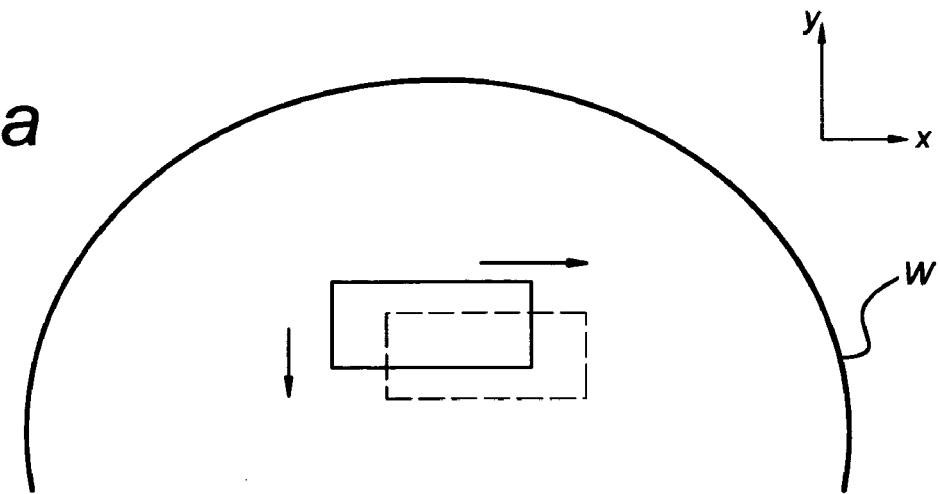
FIGS. 6a-e illustrate various thermally-induced target field deformations.
Figure 6B:
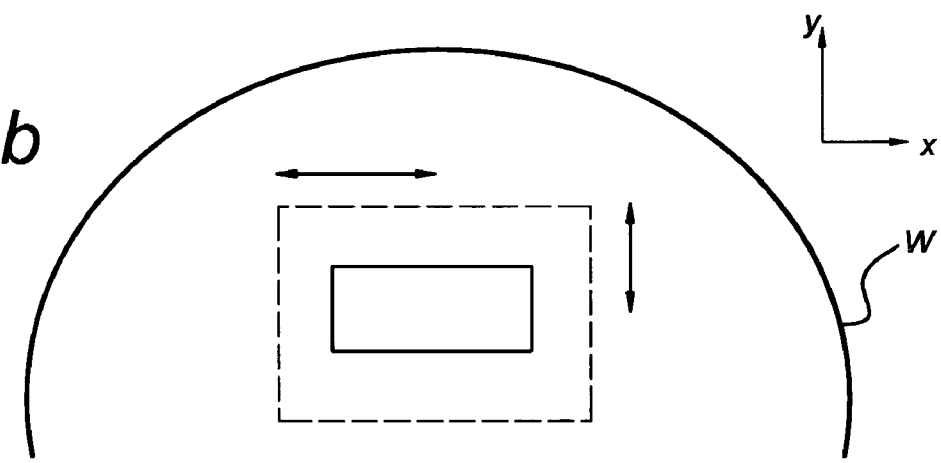
Figure 6C:
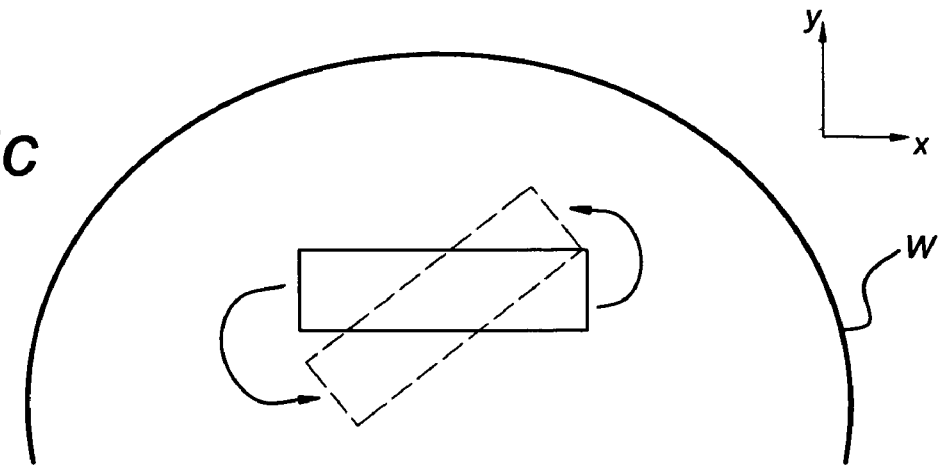
Figure 6D:
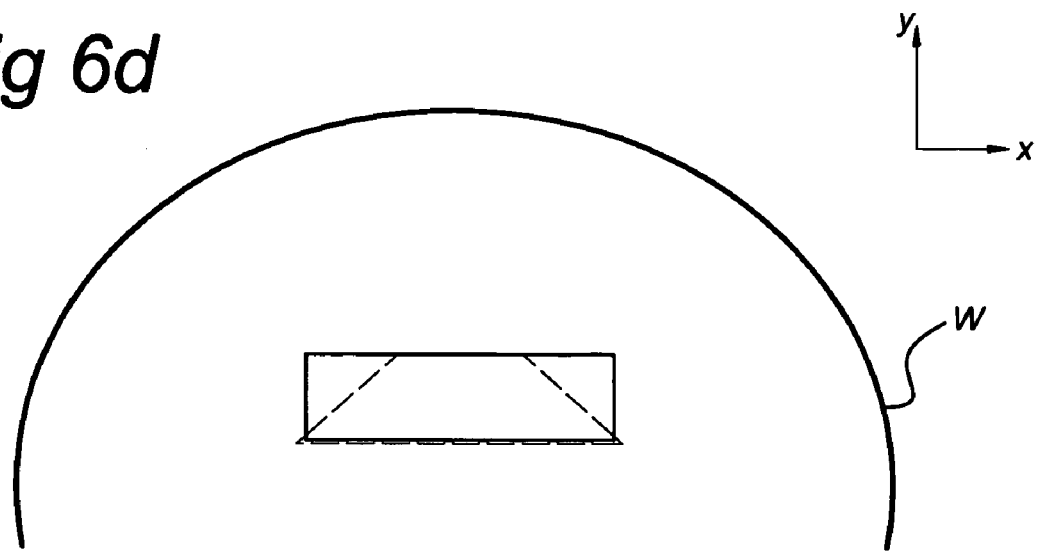
Figure 6E:
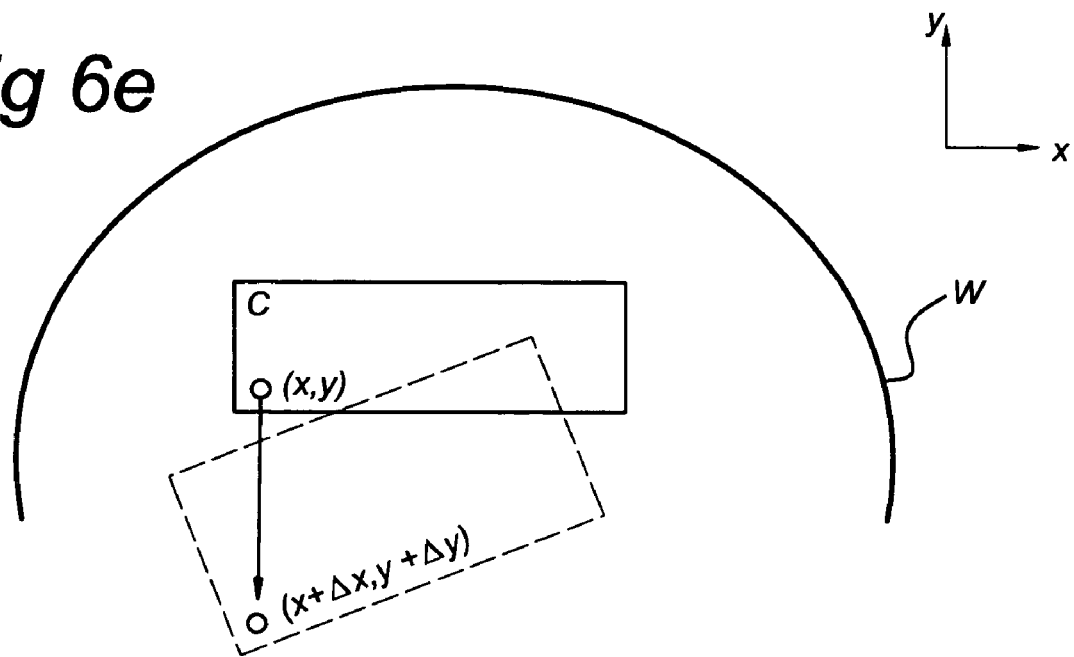

Target field deformations may occur in different forms. They include translation deformations (FIG. 6a), magnification deformations (FIG. 6b), rotational deformations (FIG. 6c), shape deformations (FIG. 6d) and/or any combination thereof (FIG. 6e).

FIG. 7 schematically shows an exemplary trajectory of reservoir 10 present underneath a projection system PL over a substrate W in a prior art lithographic projection apparatus during exposure. The substrate W comprises a number of target fields $C_i$ (i=1, . . . ,N). Throughout this description, target field $C_i$ is presented as an area with a certain size and positioned at a certain location on substrate W. However, it must be understood that target field $C_i$ may also refer to an area on a different substrate than substrate W, e.g. to any target area on a subsequent substrate within a batch, the target area having a similar size and present at a similar location as $C_i$ would have on substrate W.

The way in which a target field $C_i$ is affected, depends among others on the thermal properties of the substrate W, such as absorption, conduction, radiation etc. and similar thermal properties of patterns that are positioned on the substrate W during earlier exposures.

An exposure of target field $C_i$ may also heat adjacent target fields $C_{i+k}$ surrounding target field $C_i$. As the successive adjacent target field $C_{i+1}$ is subsequently exposed, the preceding target field $C_i$ proceeds to cool, but may also experience some residual heating due to the exposure of target field $C_{i+1}$. Consequently, size, number and mutual spacing of the target fields $C_i$ on the substrate W are important parameters that have an influence on overlay errors due to thermal deformations by heating.

Moreover, in an immersion lithographic apparatus, while exposing target field $C_i$, the substrate W may be cooled down by water evaporation causing all consecutive fields $C_1$-$C_N$ to be deformed. Although size, number and spacing of the target fields $C_i$ also play a role in thermal deformation by cooling, more important for a cooling process is the exposure sequencing. For example, introducing different field size may lead to a situation wherein the sequencing of exposure is changed. This change introduces another thermal deformation effect. However, different field size does not have to lead to a different deformation pattern if the path followed by the substrate is not changed. Note that this is different for substrate heating by exposure, since in that case field size plays an important role due to the fact that a substrate receives a different amount of energy.

Figure 8:
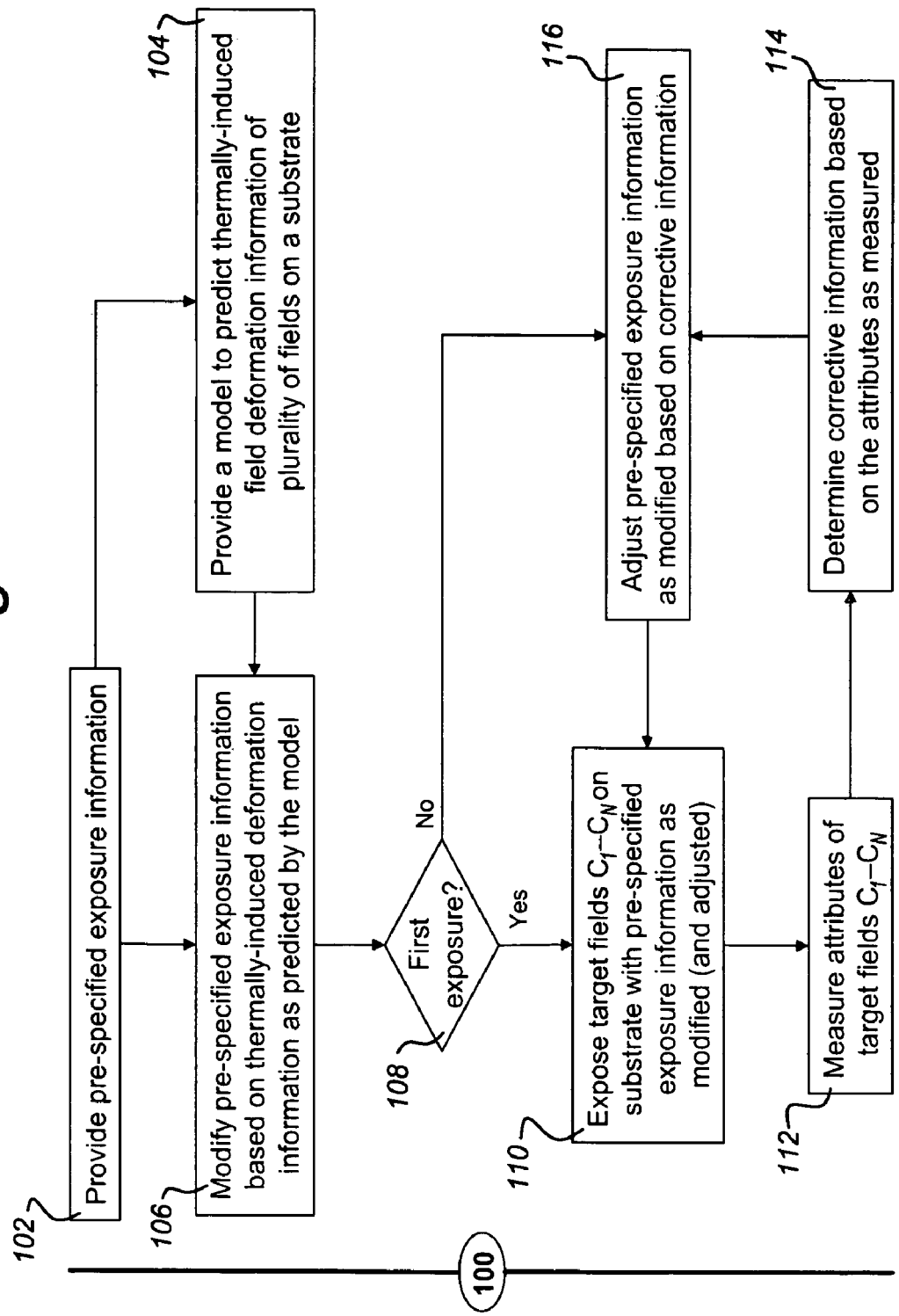
FIG. 8 schematically shows a schematic function flow diagram depicting an embodiment of the present invention.

FIG. 8 schematically depicts a flow diagram of the general inventive concept of thermal correction process 100, constructed and operative in accordance with a particular embodiment of the present invention. The correction process starts with two actions, i.e. action 102 and action 104.

In action 102 an initial exposure recipe is provided. The exposure recipe designates an amount of energy to be focused by the projection beam PB onto each target field $C_1$-$C_N$ of substrate W to comply with features that are specified by a manufacturer and profile of the exposed pattern. The exposure recipe may include exposure time, exposure energy, exposure coordinate positioning and exposure sequencing.

In action 104, a model is provided to predict thermally-induced field deformation information of a plurality of fields on a substrate. The model may use the pre-specified exposure information, as provided in action 102. The prediction of the thermally-induced deformation information may be modeled as:

$$\Delta r \approx \sum_i T_i D_i$$

where $\Delta r$ represents the predictive time-dependent deformation effects;

$T_i$ represents timing effects in a point i; and $D_i$ represents spatial effects of a point i.

Figure 9:
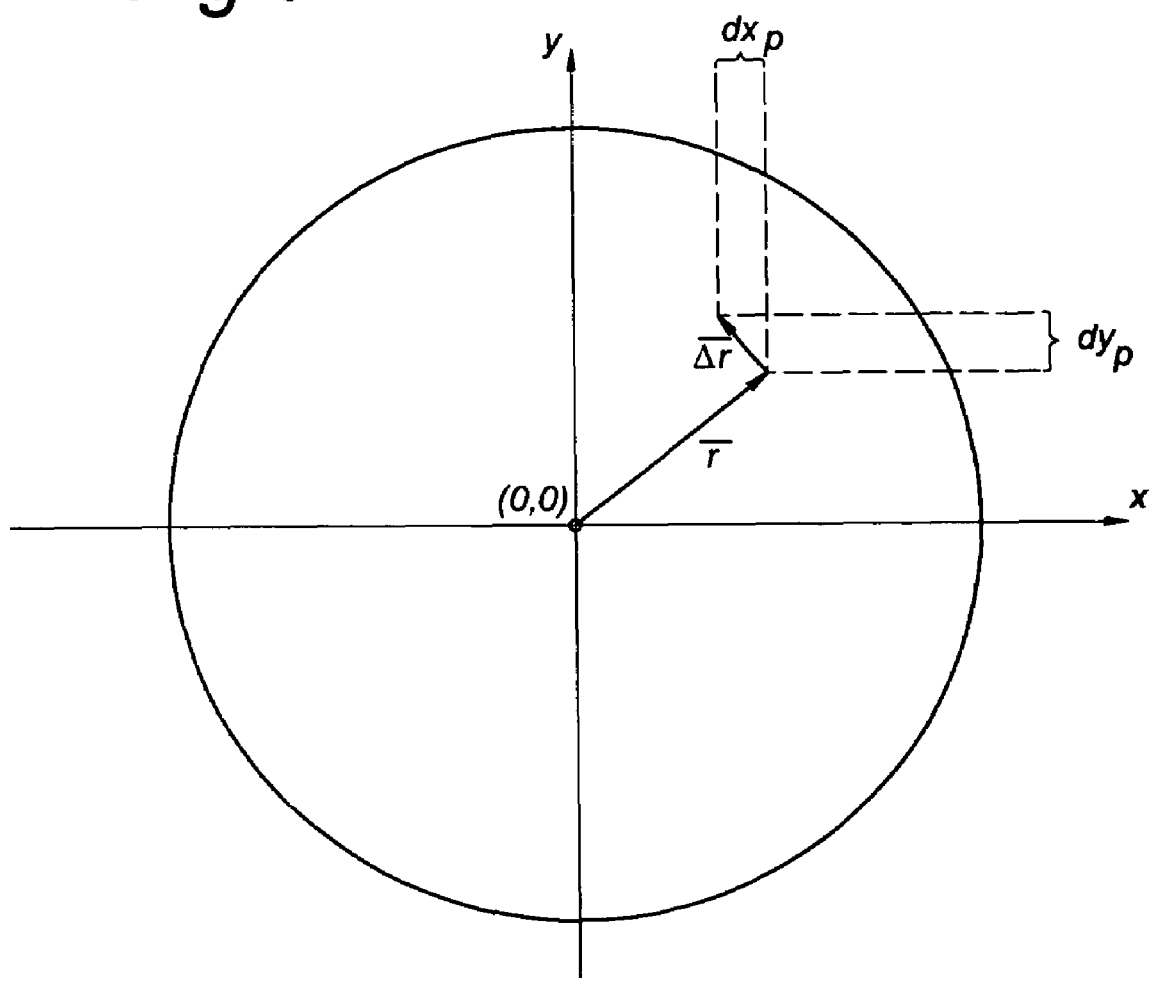
FIG. 9 schematically shows a decomposition of a predictive time-dependent deformation effect in accordance with an embodiment of the present invention.

As shown in FIG. 9, $\Delta r$ may be expressed as a function of $dx_p$ and $dy_p$, i.e. $\Delta r = (dx_p, dy_p)$, where $x_p$ and $y_p$ are predictive time-dependent deformation effects in an x and y-direction respectively.

Thus the following set of calculated predictive temporal deformation information may be calculated as follows:

$$dx_p = \sum_i T_i^x D_i^x$$

$$dy_p = \sum_i T_i^y D_i^y$$

where $T_i^x$ represents timing effects of exposing a target field $C_i$ in an x-direction;

$T_i^y$ represents timing effects of exposing a target field $C_i$ in a y-direction;

$D_i^x$ represents spatial effects in the x-direction induced by a distance between a point within an exposed target field $C_i$ and a point in a target field to be currently exposed;

$D_i^y$ represents spatial effects in the y-direction induced by a distance between a point within an exposed target field $C_i$ and a point in a target field to be currently exposed.

a. Exposure Heating

In this case, the prediction of the thermally-induced deformation information is significantly affected by local deformations that are caused by the energy applied on previously-exposed dies. Therefore, in case of deformations induced by heating of a target field $C_i$, i.e. a die, as a result of a lithographic exposure, $T_i$ and $D_i$ may be expressed as:

$$T_i = \exp\left(-\frac{t-t_i}{\tau}\right)$$

where $\tau$ represents a time sensitivity constant which depends on the thermal properties of the lithographic exposure components;

t represents absolute time; and $t_i$ represents time during which target field $C_i$ is exposed.

and $$D_i = k \exp\left(-\frac{|r_i - r|}{\chi}\right) \text{ where}$$

$r_i$ represents a point on target field $C_i$ at which overlay is estimated, the point lying on the exposure route that is followed by reservoir 10 filled with liquid 11;

r represents a point on the substrate W that is currently being exposed;

$\chi$ represents spatial thermal properties of the lithographic exposure components (e.g. exposure chuck, substrate processing, etc.), and k represents a proportionality constant that depends on thermal properties of the lithographic exposure components but will generally be constant for a given set of components.

The thermal effects of exposing a target field $C_i$ will decay in time as energy is transported across the substrate W. The spatial effects relate to the distance $|r_i - r|$ between an exposed target field $C_i$ and a target field to be exposed.

b. Immersion Cooling

In this case, the prediction of the thermally-induced deformation information is significantly affected by the energy applied on a substrate W while exposing previous dies. Consequently, the thermal effects $T_i$ are modeled in a similar way as for exposure heating. However, the spatial effects are modeled in a different way. In comparison to exposure heating, thermal deformation is not limited to the field $C_i$ that is exposed during a certain period of time. Liquid 11 covers a larger area, and evaporation of the liquid 11 may well occur away from the field, e.g. at the circumference of reservoir 10. Thermal deformation on a point $\bar{r}_0$ caused by this cooling phenomenon may now be estimated by:

$$\bar{F}(\bar{r}_0, \bar{r}_c) = \sum_{i: \bar{r}_i \in SH(\bar{r}_c) \cap W}^{N} (\bar{r}_i - \bar{r}_0) \exp(-|\bar{r}_i - \bar{r}_0|/\chi) / |\bar{r}_i - \bar{r}_0| \text{ where}$$

$\bar{r}_0$ represents a point where overlay is estimated;

$SH(\bar{r})$ represents a combination of final element FE of the projection system PL, reservoir 10, liquid 11 and seal member 12, also referred to as "showerhead" SH;

$\bar{r}_c$ represents a position of a center of the showerhead SH during exposure of a substrate; and N is a maximal number needed for integral estimation.

During exposure of a substrate W, shower head SH follows a substrate exposure route, i.e. as shown in FIG. 7.

As a result an overlay effect on the substrate W may be estimated by:

$$d\bar{r}(\bar{r}_j) = \sum_{i=0}^{j} \bar{F}(\bar{r}_j, \bar{r}_i) T_{ij} = \sum_{i=0}^{j} \bar{F}(\bar{r}_j, \bar{r}_i) \exp(-|t_i - t_j|/\tau)$$

Now, $D_i$ may be rewritten as:

$$D(\bar{r}_i, \bar{r}) = \sum_{i: \bar{r}_j \in SH(\bar{r}) \cap W}^{N} (\bar{r}_j - \bar{r}_i) \exp(-|\bar{r}_j - \bar{r}_i|/\chi) / |\bar{r}_j - \bar{r}_i| \text{ where}$$

$r_i$ represents a point on target field $C_i$;

r represents a point on the substrate W that is currently being followed by the showerhead SH;

$\chi$: represents spatial thermal properties of lithographic exposure components;

N is a maximal number needed for integral estimation; and

W is the substrate.

$D_i$ is thus calculated for each pair of points as a summation of the thermal effects on the substrate taken along the radius of the showerhead with its center in one point and with respect to another point.

Aforementioned thermal analysis, however, does not take into account any additional thermally-induced deformations caused by edge effects on the substrate W. On an edge, the substrate W has less constraints to deform, and therefore thermally-induced deformations have a different nature at such a location.

Therefore, in an embodiment of the present invention, in addition to aforementioned thermal disturbances of adjacent dies within the substrate, within the model also an edge effect is estimated. This estimate may be calculated by including one or more of the following:

1. A deformation on an edge of a substrate depends on a distance of an energy source from the edge of the substrate. To estimate an edge effect the minimum distance from a point to the edge may be taken into account.

Figure 10:
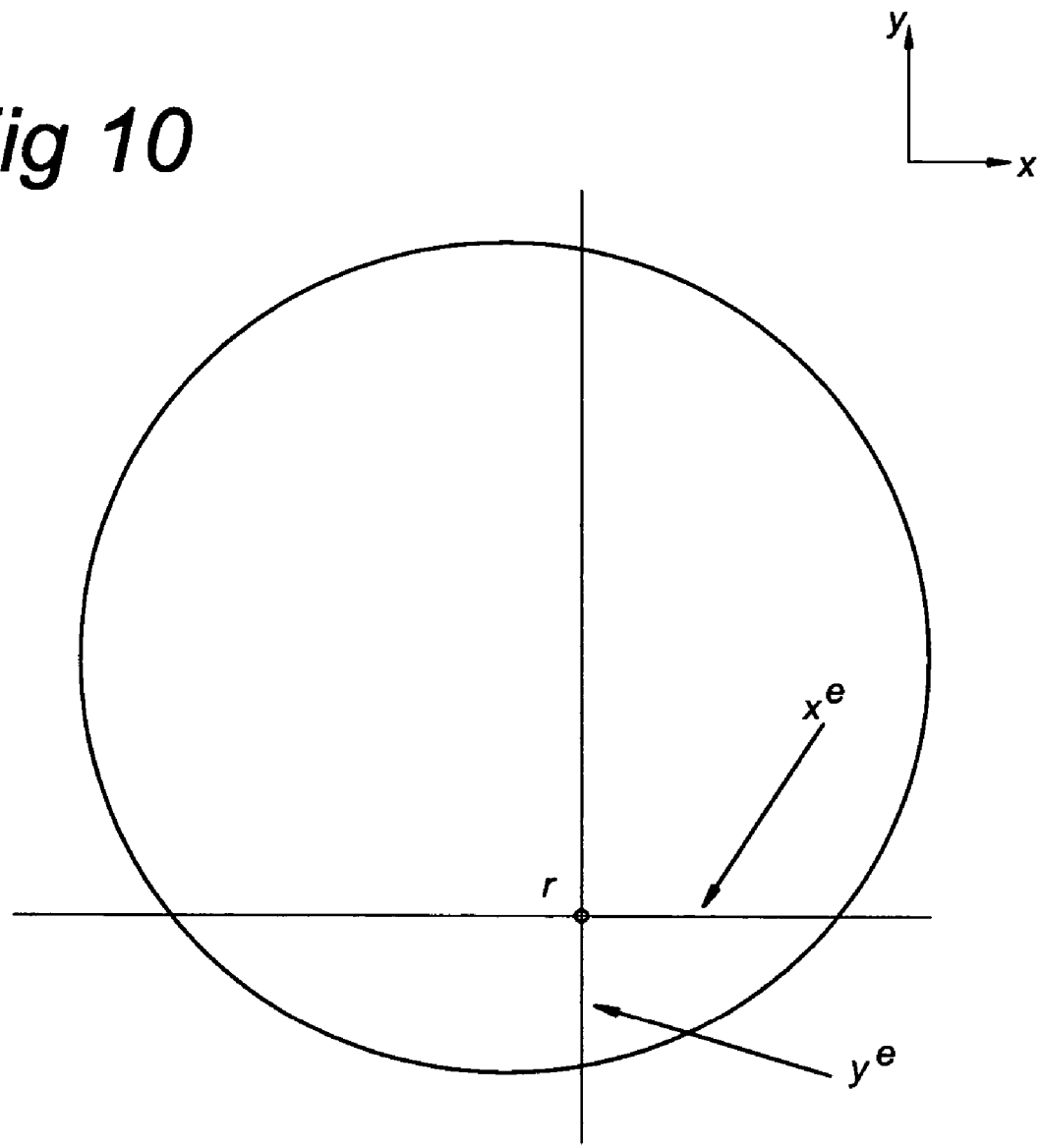
FIG. 10 schematically shows a decomposition of a distance to an edge of a substrate as employed in an embodiment of the present invention.

The distance to the edge, schematically shown in FIG. 10, is calculated as $$x^e(\bar{r}_i) = \min(|x_i - \sqrt{R^2 - y_i^2}|, |x_i + \sqrt{R^2 - y_i^2}|)$$

$$y^e(\bar{r}_i) = \min(|y_i - \sqrt{R^2 - x_i^2}|, |y_i + \sqrt{R^2 - x_i^2}|) \text{ where}$$

$x^e$ represents a distance to an edge of substrate W in an x-direction;

$y^e$ represents a distance to an edge of substrate W in a y-direction;

$x_i$ represents an x-coordinate of $r_i$;

$y_i$ represents an y-coordinate of $r_i$; and

R represents a radius of substrate W.

An edge overlay effect would then be estimated as:

$$d\tilde{x}(\bar{r}_i) = \frac{d\bar{r}(\bar{r}_i)_x}{|d\bar{r}(\bar{r}_i)|} / (p_1^x + p_2^x x_i^e)$$

$$d\tilde{y}(\bar{r}_i) = \frac{d\bar{r}(\bar{r}_i)_y}{|d\bar{r}(\bar{r}_i)|} / (p_1^y + p_2^y y_i^e)$$

$d\tilde{x}(\bar{r}_i)$ and $d\tilde{y}(\bar{r}_i)$ are first estimates of an edge overlay effect in an x-direction and y-direction respectively;

$d\bar{r}(\bar{r}_i)_x$ is a deformation that is caused by the projection system PL with immersion liquid 11 at point $\bar{r}_i$ of which $d\bar{r}(\bar{r}_i)_x$ and $d\bar{r}(\bar{r})_y$ are x and y components respectively; and $p_{1,2}^{x,y}$ are first and second parameters respectively in x- and y-direction respectively that are obtained by a fit.

2. In the case of immersion cooling, edge deformations also depend on an amount of energy that is transferred from the substrate W to the immersion liquid 11 between the substrate W and the projection system PL. It can be estimated that this dependency can be taken to be proportional to a logarithm of the period during which the immersion liquid remains on the substrate W. In the model it may be realized as:

$$dx_{edge}(\bar{r}_i) = \log(f_i + 1) \frac{d\tilde{x}(\bar{r}_i)}{\log(M)}$$

$$dy_{edge}(\bar{r}_i) = \log(f_i + 1) \frac{d\tilde{y}(\bar{r}_i)}{\log(M)} \text{ where}$$

$dx_{edge}(\bar{r}_i)$ and $dy_{edge}(\bar{r}_i)$ represent further estimates of an edge overlay effect in the x- and y-direction respectively in which the dependency upon the amount of energy taken by liquid 11 in reservoir 10 is taken into account.

$f_i$ represents an index of a point that is being exposed according to a route of exposure; and M represents a total number of points.

It can be seen that $dx_{edge}(\bar{r}_i)$ and $dy_{edge}(\bar{r}_i)$ will largely grow when $\bar{r}_i$ would come closer to the edge of the substrate W. To avoid this, a minimum edge distance correction can be introduced, which may take the form of:

$$Y(\bar{r}_i) = \max(|\bar{r}_i|, 0.95 \cdot R) \text{ where}$$

$Y(\bar{r}_i)$ represents the minimum edge distance correction.

With this correction, the distance to an edge of substrate W in the x-direction and y-direction respectively, may be expressed as:

$$x^e(\bar{r}_i) = \min(|x_i/Y(\bar{r}_i) - \sqrt{R^2 - y_i^2/Y^2(\bar{r}_i)}|, |x_i/Y(\bar{r}_i) + \sqrt{R^2 - y_i^2/Y^2(\bar{r}_i)}|) \text{ and}$$

$$y^e(\bar{r}_i) = \min(|y_i/Y(\bar{r}_i) - \sqrt{R^2 - x_i^2/Y^2(\bar{r}_i)}|, |y_i/Y(\bar{r}_i) + \sqrt{R^2 - x_i^2/Y^2(\bar{r}_i)}|)$$

A set of total overlay corrections may then be expressed as:

$$dx_i^{total} = dx(\bar{r}_i, C_1^x, C_2^x, \chi^x, \tau^x, p_1^x, p_2^x) = C_1^x d\bar{r}(\bar{r}_i, \chi^x, \tau^x)_x + C_2^x dx_{edge}(\bar{r}_i, d\bar{r}(\bar{r}_i), p_1^x, p_2^x)$$

$$dy_i^{total} = dy(\bar{r}_i, C_1^y, C_2^y, \chi^y, \tau^y, p_1^y, p_2^y) = C_1^y d\bar{r}(\bar{r}_i, \chi^y, \tau^y)_y + C_2^y dy_{edge}(\bar{r}_i, d\bar{r}(\bar{r}_i), p_1^y, p_2^y) \text{ where}$$

$dx_i^{total}$ and $dy_i^{total}$ represent the total overlay correction in the x-direction and y-direction respectively at a point $r_i$;

$\tau^x$ and $\tau^y$ represent a time sensitivity constant which depends on the thermal properties of the lithographic exposure components for the x-direction and y-direction respectively;

$\chi^x$ and $\chi^y$ represent spatial thermal properties of the lithographic exposure components (e.g. exposure chuck, substrate processing, etc.) in an x-direction and y-direction respectively; and $C_{1,2}^{x,y}$ are first and second constants respectively in an x-direction and y-direction respectively, of which the first constant corresponds to the term related to an overlay correction due to a bulk effect and the second constant corresponds with the term related to an overlay correction due to an edge effect.

Thermal correction process 100 then advances to action 106, i.e. modifying the pre-specified exposure information based on thermally-induced deformation information as predicted by the model. Thus, by having a prediction as to how thermal effects deform a target field $C_i$ as energy is transported across the wafer substrate W, the predicted deformation information may be used to modify the pre-specified exposure information for each target field $C_1$-$C_N$ in order to reduce chances of overlay errors in a field $C_i$. The modified pre-specified exposure information may include calculated exposure position offsets to adjust exposure coordinate positions or other adjustable exposure parameters.

In action 108, thermal correction process 100 continues by selecting whether a first exposure with the pre-specified exposure information as modified in action 106 will be exposed. It must be noted that in other embodiments of the invention this choice may be applied more often, and will not be limited to the first exposure. Furthermore, it must be understood that first exposure is not limited to the first exposure of a specific substrate. It may also refer to a first exposure of a specific pattern to be exposed on a batch of substrates.

If it is the first exposure, thermal correction process 100 continues to action 110, i.e. exposing fields $C_1$-$C_N$ on substrate W with pre-specified exposure information as modified in action 106. Thus each of the target fields $C_1$-$C_N$ is exposed with the desired pattern via a lithographic apparatus in accordance with the modified pre-specified exposure information, including applied dosages, exposure coordinate positioning and exposure sequencing. It must be understood that action 108 may be absent. In this case the method directly continues with exposing fields in accordance with action 110 after modification of the pre-specified exposure information in action 106.

Finally, as will be clear for a person skilled in the art, the method as described thus far does not need to be applied to all substrates within a batch. After modifying the pre-specified exposure information based on thermally-induced deformation information as predicted by the model, i.e. action 106, all substrates within the batch reserved to undergo the same exposure, may be exposed with the same pre-specified exposure information as modified.

It may well be that aforementioned modifications do not compensate for all thermally-induced deformations. Therefore, it is possible to enhance thermal correction process 100 further by measuring attributes of the exposed fields on the substrate W in action 112. The measuring is configured to measure various attributes and artifacts of target fields $C_1$-$C_N$ and/or substrate W that evince thermal effects, like cooling. Such measured attributes may include, for example, size of individual target fields C, specific test patterns, layer dependent alignment marks, gaps between target field C features, X and/or Y diameter of target fields, holes and/or posts etc. and may be performed by mechanisms internal to lithographic exposure apparatus or by external devices.

Based on the measured attributes of the exposed target fields $C_1$-$C_N$, thermal correction process 100 determines in action 114 corrective information to revise the predicted thermally-induced deformation information. This means that the information obtained by the measurement of attributes may lead to an updated set of predictive deformations for a plurality of selected points within each target field $C_i$.

The updated set of predictive deformations for a plurality of selected points within each target field $C_i$ as determined in action 114 may be used, in action 116, to adjust the pre-specified exposure information, which was already modified in action 106. The corrective information offsets are then fed back to the modified pre-specified exposure information for adjustment, so the modified and adjusted pre-specified exposure information may be used, in action 110, for subsequent exposure, e.g. on subsequent substrates in a batch.

It should be understood that, alternatively, in action 110, a single target field $C_i$ may be exposed with pre-specified information as modified. In action 112, the attributes of this target field $C_i$ may then be measured, and based on these attributes as measured, in action 114, corrective information may be determined. The pre-specified exposure information as modified may then, in action 116, be adjusted based on this corrective information. Finally, subsequent fields $C_i$ on the same substrate W may be exposed with pre-specified exposure information as modified and adjusted in action 110, etc.

The pre-specified exposure information may include exposure time, exposure sequencing, and exposure coordinate information. Actions 110, 112, 114, 116 in thermal correction process 100 may be iterated several times, e.g. on subsequent substrates in a batch, until the exposed patterns within the fields $C_1$-$C_N$ on the substrates achieve desired features and profile specified by a manufacturer by the original pre-specified exposure information. Subsequent substrates may then be exposed by the pre-specified exposure information as modified and adjusted in accordance with the last results of the iteration process.

The arrow between action 108 and action 116 denotes the situation for substrates in a batch of substrates that are reserved to undergo the same exposure as the first substrate(s) for which corrective information is determined on the basis of measured attributes in actions 114 and 112 respectively. As the pre-specified exposure information as modified is already adjusted based on aforementioned corrective information, these substrates may be exposed directly with the latter exposure information in action 110.

Figure 11:
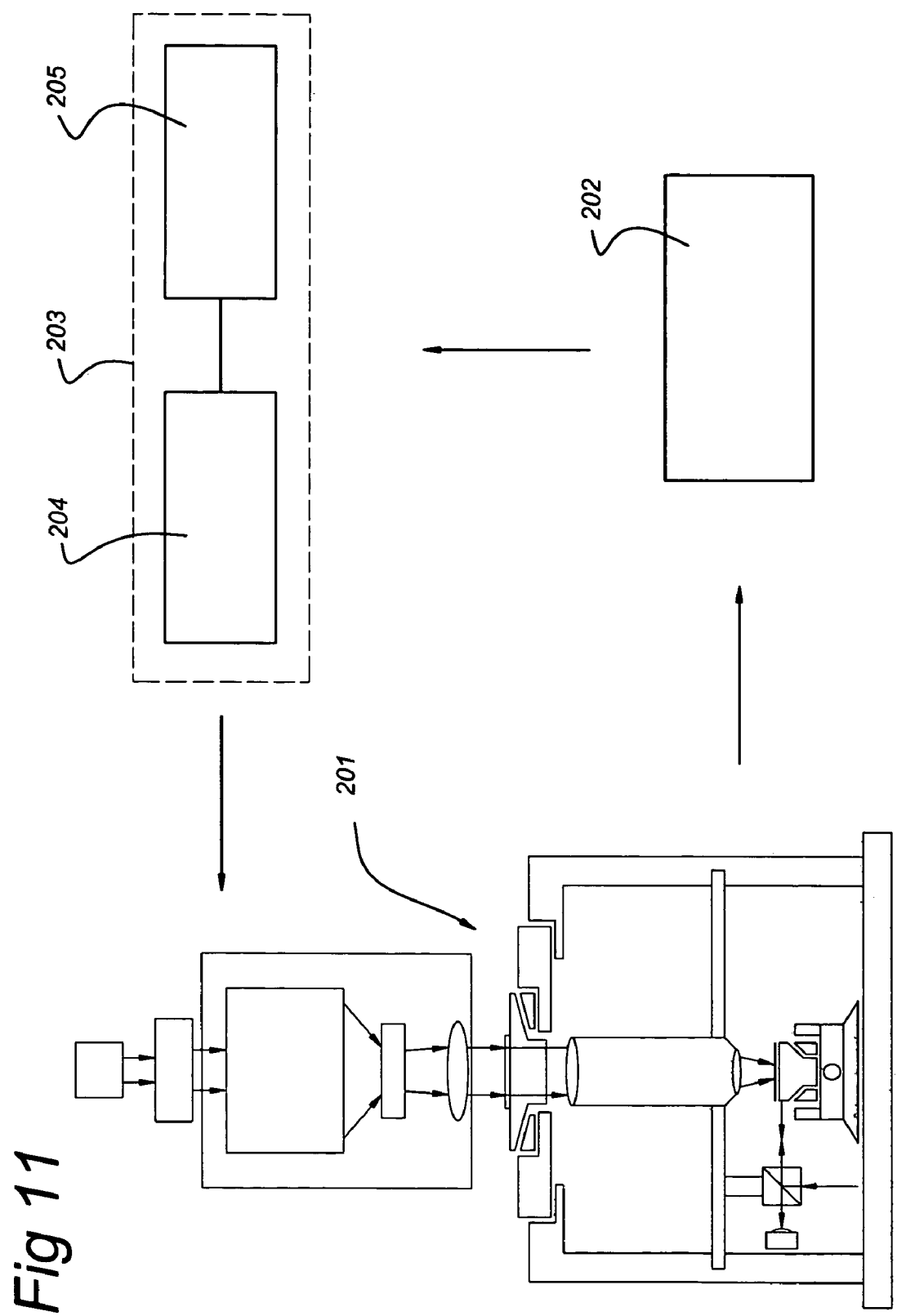
FIG. 11 shows an arrangement according to an embodiment of the present invention.

FIG. 11 depicts a lithography apparatus 201 according to an embodiment of the present invention. In this embodiment, the substrate, which is exposed with the lithographic apparatus 201, is transferred (after development by a track) to a measurement station 202. The measurement station 202 is connected to a processor unit 203 that includes a processor 204 and a memory 205. The measurement station 202 measures attributes of a plurality of fields provided on the substrate. The measurement station 202 is arranged to obtain measurement data and to provide these measurement data to the processor unit 203. In the memory 205 of the processor unit 203, pre-specified exposure information may be stored regarding the pattern to be exposed on a substrate W. The processor 204 of the processor unit 203 is used to determine a model to predict thermally-induced field deformation information of the plurality of field of substrate W by comparing the measurement data, received from the measurement station 202, and the pre-specified exposure information, stored in the memory 205. The determined model may be stored in memory 205 as well. With the determined model, the processor unit 203 is capable of predicting thermally-induced field deformation information and modify the pre-specified exposure information. The processor unit 203 may provide the modified pre-specified exposure information to the lithographic apparatus 201. The lithographic apparatus 201 may use this information in an exposure of subsequent substrates W.

In an alternative embodiment, the derived values of these parameters are not supplied to the lithographic apparatus 201, but to a different entity, like a track, a computer terminal or a display. In the latter case, an operator, who is responsible for the operation of the lithographic apparatus 201, may then be able to check whether predicted overlay errors fall within preset overlay requirements or not. In yet another embodiment, the mathematical model may be stored in a different entity than the processor unit 203. In an embodiment of the invention, both the lithographic apparatus 201 and the measurement station 202 may be connected to the same track in order to efficiently control parameters of the lithographic apparatus 202.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may have been made above to the use of embodiments of the invention to compensate for cooling caused by evaporation of an immersion liquid in an immersion lithographic apparatus, it must be understood that several embodiments of the invention may also be used to compensate for thermally-induced deformation that are caused by heating of the substrate due to radiation in a conventional optical lithographic apparatus, i.e. an optical lithographic apparatus without the presence of an immersion liquid.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method for predicting thermally-induced field deformation of a substrate to be exposed lithographically comprising:
   providing pre-specified exposure information;
   using a model to predict thermally-induced field deformation at selected points of the substrate based on the pre-specified exposure information;
wherein the model is based on
   a time-decaying characteristic as energy is transported across said substrate; and a distance between the selected points and an edge of said substrate.

2. The method of claim 1, wherein the model is further based on a distance between the selected points and an energy source.

3. The method of claim 1, comprising:
determining improved exposure information based on the predicted thermally induced field deformation.

4. The method of claim 3, wherein said determining improved exposure information includes adjusting exposure field sequencing information.

5. The method of claim 3, further comprising:
exposing a plurality of fields using the improved exposure information.

6. The method of claim 5, wherein each field of said plurality of fields has one or more of the selected points.

7. The method of claim 5, wherein the method after said exposing further comprises:
collecting measurements regarding attributes of a first field of said plurality of fields;
assessing deformation of said first field induced by thermal effects of said exposing using the measurements;
determining corrective information based on the assessed deformation;
correcting the improved exposure information based on said corrective information.

8. The method of claim 6, wherein, in said model, predicting deformation at selected points is expressed by:

$$dx_p = \sum_i T_i^x D_i^x; \text{ and}$$

$$dy_p = \sum_i T_i^y D_i^y; \text{ where}$$

$T_i^x$ represents timing effects of exposing a target field $C_i$ in an x-direction;
$T_i^y$ represents timing effects of exposing a target field $C_i$ in a y-direction;
$D_i^x$ represents spatial effects in the x-direction induced by a distance between a point within an exposed target field $C_i$ and a point in a target field to be currently exposed;
$D_i^y$ represents spatial effects in the y-direction induced by a distance between a point within an exposed target field $C_i$ and a point in a target field to be currently exposed;
$dx_p$: represents predicted deformation along the x axis; and
$dy_p$: represents predicted deformation along the y axis; and where $$T_i = \exp\left(-\frac{t-t_i}{\tau}\right) \text{where}$$

represents absolute time;
$t_i$ represents time during which target field $C_i$ is exposed;
$\tau$: represents a time sensitivity constant which depends on thermal properties of lithographic exposure components; and $$D_i = k\exp\left(-\frac{|r_i - r|}{\chi}\right):$$

represents effects induced by a distance $|r_i-r|$ between an exposed field and a field to be currently exposed in either the x or y direction;
$r_i$ representing a point on target field $C_i$;
r representing a point on the substrate W that is currently being exposed;
$\chi$: representing spatial thermal properties of lithographic exposure components;
k: representing a proportionality constant that depends on thermal properties of lithographic exposure components.

9. The method of claim 1, wherein said pre-specified exposure information includes at least one of exposure energy information, exposure time information, exposure field position information, exposure field sequencing information, and exposure field deformation information.

10. The method of claim 1, wherein the model is further based on an amount of energy transferred from the substrate to a first material with which the substrate is in contact during a first period.

11. The method of claim 10, wherein said amount of energy is modeled to be proportional to a logarithm of the period.

12. The method of claim 10, wherein the material is an immersion liquid and said thermally-induced field deformations are caused by cooling of the substrate due to evaporation of the immersion liquid.

13. The method of claim 10, wherein, in said model, said predicting of deformation at the selected points based on a time-decaying characteristic is expressed by:

$$dx_p = \sum_i T_i^x D_i^x; \text{and}$$

$$dy_p = \sum_i T_i^y D_i^y; \text{where}$$

$T_i^x$ represents timing effects of exposing a target field $C_i$ in an x-direction;
$T_i^y$ represents timing effects of exposing a target field $C_i$ in a y-direction;
$D_i^x$ represents spatial effects in the x-direction induced by a distance between a point within an exposed target field $C_i$ and a point in a target field to be currently exposed;
$D_i^y$ represents spatial effects in the y-direction induced by a distance between a point within an exposed target field $C_i$ and a point in a target field to be currently exposed;
$dx_p$: represents, predicted deformation along the x axis; and
$dy_p$: represents predicted deformation along the y axis; and where $$T_i = \exp\left(-\frac{t-t_i}{\tau}\right) \text{ where}$$

t represents absolute time;
$t_i$ represents time during which target field $C_i$ is exposed;
$\tau$: represents a time sensitivity constant which depends on the thermal properties of lithographic exposure components; and $$D(\bar{r}_i, \bar{r}) = \sum_{i: r_j \in SH(\bar{r}) \cap W}^{N} (\bar{r}_j - \bar{r}_i) \exp(-|\bar{r}_j - \bar{r}_i|/\chi)/|\bar{r}_j - \bar{r}_i| :$$

represents effects induced by a distance $|r_j-r|$;

SH($\bar{r}$): representing a combination of a final element of a projection system, a reservoir provided with a seal member and arranged to be filled with the immersion liquid, also referred to as "showerhead";

$r_i$ representing a point on target field $C_i$ at which overlay is estimated;

r representing a point on the substrate that is currently being followed by the showerhead; and where $\chi$: represents spatial thermal properties of lithographic exposure components;

N is a maximal number needed for integral estimation; and

W is the substrate.

* * * * *